(12) United States Patent
Abe et al.

(10) Patent No.: US 7,708,910 B2
(45) Date of Patent: *May 4, 2010

(54) INK FOR INK JET PRINTING AND METHOD FOR PREPARING THE SAME

(75) Inventors: Noriyuki Abe, Chiba-ken (JP); Masaaki Oda, Chiba-ken (JP)

(73) Assignee: ULVAC, Inc., Kanagawa (JP)

( * ) Notice: Subject to any disclaimer, the term of this patent is extended or adjusted under 35 U.S.C. 154(b) by 169 days.

This patent is subject to a terminal disclaimer.

(21) Appl. No.: 10/240,767

(22) PCT Filed: Oct. 21, 2001

(86) PCT No.: PCT/JP01/09005
§ 371 (c)(1),
(2), (4) Date: Oct. 15, 2002

(87) PCT Pub. No.: WO02/31068
PCT Pub. Date: Apr. 18, 2002

(65) Prior Publication Data
US 2003/0110978 A1 Jun. 19, 2003

(30) Foreign Application Priority Data
Oct. 13, 2000 (JP) ............................. 2000-313592

(51) Int. Cl.
*B01F 3/12* (2006.01)
*C09D 5/10* (2006.01)
*B32B 1/00* (2006.01)

(52) U.S. Cl. ........................ 252/512; 252/514; 252/500; 252/62.55; 428/402; 428/403; 427/212; 427/213.3; 427/216; 427/220; 75/343; 75/348; 75/362; 75/722; 977/777; 977/810

(58) Field of Classification Search ................. 252/500, 252/510, 512–514; 106/1.27, 1.18–1.21, 106/31.13; 516/34, 922; 75/362, 722, 343, 75/348; 428/402–403; 427/213.3, 212, 216, 427/220; 977/777, 810
See application file for complete search history.

(56) References Cited

U.S. PATENT DOCUMENTS 5,922,403 A * 7/1999 Tecle .......................... 427/212

(Continued)

FOREIGN PATENT DOCUMENTS

JP 03-034211 * 2/1991

(Continued)

OTHER PUBLICATIONS

International Search Report, (PCT/ISA/210.

*Primary Examiner*—Stanley Silverman
*Assistant Examiner*—Kallambella Vijayakumar
(74) *Attorney, Agent, or Firm*—Arent Fox LLP

(57) ABSTRACT

The present invention relates to ink jet printing ink consisting of an independently dispersed metal ultrafine particles-containing liquid dispersion in which the metal ultrafine particles having a particle size of not more than 100 nm are independently and uniformly dispersed and which is excellent in characteristic properties required for ink. The ink is used in the printing or the formation of conductive circuits using an ink jet printer. The ink can be prepared by steps comprising the first step in which metal vapor is brought into contact with vapor of the first solvent according to the evaporation-in-gas technique to thus form a metal ultrafine particles-containing liquid dispersion; the second step in which a low molecular weight polar solvent as the second solvent is added to the liquid dispersion to thus precipitate the metal ultrafine particles and to extract and remove the first solvent; and the third step in which the third solvent is added to the resulting precipitates to carry out solvent-substitution and to thus give a liquid dispersion containing metal ultrafine particles independently and uniformly dispersed therein, a dispersant being added in the first step and/or the third step.

2 Claims, 1 Drawing Sheet

100 nm

U.S. PATENT DOCUMENTS

| | | | |
|---|---|---|---|
| 5,948,512 A * | 9/1999 | Kubota et al. | 427/466 |
| 6,086,790 A * | 7/2000 | Hayashi et al. | 252/500 |
| 6,103,868 A * | 8/2000 | Heath et al. | 528/482 |
| 6,153,348 A * | 11/2000 | Kydd et al. | 430/119 |
| 6,254,662 B1 * | 7/2001 | Murray et al. | 75/348 |
| 6,262,129 B1 * | 7/2001 | Murray et al. | 516/33 |

FOREIGN PATENT DOCUMENTS

| | | | |
|---|---|---|---|
| JP | 09-012948 | * | 1/1992 |
| JP | 07-188599 | * | 7/1995 |
| JP | 2561537 | | 12/1996 |
| JP | 10-053739 | * | 2/1998 |
| JP | 10-204350 | * | 8/1998 |
| JP | 2000-182889 | * | 6/2000 |
| WO | WO 97/24224 | * | 7/1997 |

* cited by examiner 100 nm

INK FOR INK JET PRINTING AND METHOD FOR PREPARING THE SAME

CROSS-REFERENCE TO RELATED APPLICATION

This application is a National Stage entry of International Application No. PCT/JP01/09005, filed Oct. 12, 2001, the entire specification claims and drawings of which are incorporated herewith by reference.

TECHNICAL FIELD

The present invention relates to ink having applications in, for instance, the printing operations or the formation of conductive circuits using an ink jet printer as well as a method for the preparation of the ink.

BACKGROUND ART

The ink jet printing system has been used as one of the printing systems. This ink jet printing system is a recording system, which comprises the step of printing by discharging ink drops through a discharge orifice such as a nozzle or a slit to thus make the ink drops directly adhere to a printing member and can usually fall into two broad categories: continuous injection systems and on-demand systems. The ink mainly used in such an ink jet printing system comprises a dye dissolved in an aqueous or nonaqueous solvent.

On the other hand, in the fields of colored paints and conductive paints, a liquid dispersion of metal ultrafine particles has been used, but there has not yet been used such a liquid dispersion of metal ultrafine particles in the formation of a conductive circuit, while making use of the ink jet printing system. Such a conductive circuit has conventionally been formed according to the screen printing techniques or a technique, which makes use of a photoresist and in this case, a large-scaled apparatus should be used and complicated processes should likewise be used.

As methods for preparing the foregoing liquid dispersion of metal ultrafine particles, there have been known those comprising the step of dispersing metal ultrafine particles or powder together with, for instance, a solvent, a resin and a dispersant, according to various means such as stirring, the applying of ultrasonic waves and mixing in, for instance, a ball mill or a sand mill. The liquid dispersion prepared according to this method has been employed in the fields of, for instance, paints and varnishes. There have been known, for instance, a method for directly preparing metal ultrafine particles in a liquid phase such as the technique for the evaporation of a metal in a gas phase (hereunder referred to as "evaporation-in-gas (technique)" comprising the steps of evaporating a metal in a low vacuum atmosphere in the coexistence of vapor of a solvent, and then condensing the evaporated metal into uniform metal ultrafine particles to thus disperse the resulting particles in the condensed solvent and to thus give a liquid dispersion (Japanese Patent No. 2,561,537) and those, which make use of an insoluble precipitate-forming reaction or a reducing reaction using a reducing agent. Among these methods for preparing liquid dispersions of metal ultrafine particles, the evaporation-in-gas technique would permit the stable preparation of a liquid dispersion containing metal ultrafine particles having a particle size of not more than 100 nm and which are uniformly dispersed therein. In the evaporation-in-gas technique, the amount of a dispersion stabilizer or a resin component required for the preparation of a liquid dispersion containing metal ultrafine particles in a desired concentration is smaller than that required in the liquid-phase preparation technique.

As has been described above, the liquid dispersion of metal ultrafine particles has never been used as the ink for ink jet printer or recording (system) for the reason that the conventional liquid dispersion of metal ultrafine particles has never possessed characteristic properties (such as viscosity and surface tension) required for the ink used in the ink jet printing. The metal ultrafine particles prepared according to the conventional evaporation-in-gas technique undergo aggregation and this makes it difficult to prepare any liquid dispersion in which the metal ultrafine particles are stably dispersed. For this reason, when using such a liquid dispersion of metal ultrafine particles as ink for the ink jet printing, the ink suffers from a problem in that aggregates of the ultrafine particles present therein result in clogging of the ink jet nozzles. Moreover, when using a liquid dispersion in which the ultrafine particles are independently or separately dispersed, as ink for the ink jet printing, the liquid dispersion should be prepared using a solvent suitable for satisfying the requirements for characteristic properties of the ink. However, the choice of a solvent suitably used in the ink for the ink jet printing has been quite difficult.

In addition, in the conventional evaporation-in-gas technique, the solvent used is denatured when the evaporated metal is condensed to thus form by-products and accordingly, the resulting liquid dispersion would suffer from various problems such as storage stability, viscosity stability and coloring, depending on the amount of the by-products. Furthermore, in some cases or in some applications, there is a request in that low boiling point solvents, water and alcohol-containing (alcoholic) solvents, which can be used in the evaporation-in-gas technique with great difficulty, must be used for the preparation of liquid dispersions of metal ultrafine particles, as will be detailed below.

Accordingly, it is an object of the present invention to eliminate the foregoing problems associated with the conventional techniques and to provide ink, which comprises a liquid dispersion containing individually dispersed metal ultrafine particles and which can be used in the ink jet printing technique or which can satisfy the requirements for the ink jet printing ink as well as a method for preparing the same.

DISCLOSURE OF THE INVENTION

The inventors of this invention have conducted various studies to solve the foregoing problems associated with the conventional techniques and to thus develop a liquid dispersion containing metal ultrafine particles in which the metal ultrafine particles are independently dispersed or which does not undergo any aggregation between ultrafine particles, which can ensure a desired flow ability and which is excellent in characteristic properties favorable for use as ink. As a result, they have found that the foregoing problems can effectively be solved by providing a liquid dispersion prepared using specific steps and using a specific dispersant and have thus completed the present invention.

The ink jet printing ink according to the present invention comprises a liquid dispersion containing individually or separately dispersed metal ultrafine particles, which contains metal ultrafine particles and a dispersant. The metal ultrafine particles-containing liquid dispersion containing a dispersant includes ultrafine particles individually, independently and uniformly dispersed therein and maintains the desired flow ability.

The particle size of the metal ultrafine particles is in general not more than 100 nm and preferably not more than 10 nm. In addition, the viscosity of the independently dispersed metal ultrafine particles-containing liquid dispersion ranges from 1 to 100 mPa·s and preferably 1 to 10 mPa·s, the surface tension thereof ranges from 25 to 80 mN/m and preferably 30 to 60 mN/m and thus the liquid dispersion possesses characteristic properties required for the inkjet printing ink.

The dispersant used herein is at least one member selected from the group consisting of alkylamines, carboxylic acid amides and amino-carboxylic acid salts. Among them, alkylamines are those whose main chain has 4 to 20 carbon atoms, preferably 8 to 18 carbon atoms, with the primary amines being preferably used as such alkylamines.

The foregoing liquid dispersion preferably comprises, as a dispersion medium, at least one solvent selected from the group consisting of nonpolar hydrocarbons whose main chain has 6 to 20 carbon atoms, water and alcoholic solvents having not more than 15 carbon atoms.

The ink jet printing ink according to the present invention is one prepared according to steps comprising the first step in which a metal is evaporated in a gas atmosphere in the presence of vapor of the first solvent to thus prepare a metal ultrafine particles-containing liquid dispersion wherein the metal ultrafine particles are dispersed in the solvent; the second step in which a low molecular weight polar solvent, as the second solvent, is added to the liquid dispersion prepared in the first step to precipitate the metal ultrafine particles and the resulting supernatant is removed to thus substantially remove the first solvent; and the third step in which the third solvent is added to the precipitates thus recovered to give an independently dispersed metal ultrafine particles-containing liquid dispersion. The dispersant is added in the first and/or third steps.

Moreover, a method for preparing the ink jet printing ink according to the present invention comprises the first step in which a metal is evaporated in a gas atmosphere in the presence of vapor of the first solvent to thus bring the metal vapor into contact with the vapor of the first solvent, the vapor mixture is cooled and collected to give a metal ultrafine particles-containing liquid dispersion in which the metal ultrafine particles are dispersed in the solvent; the second step in which a low molecular weight polar solvent, as the second solvent, is added to the liquid dispersion prepared in the first step to precipitate the metal ultrafine particles and the resulting supernatant is removed to thus substantially remove the first solvent; and the third step in which the third solvent is added to the precipitates thus recovered to give an independently dispersed metal ultrafine particles-containing liquid dispersion. A metal ultrafine particles-containing liquid dispersion suitable for use as ink jet printing ink can be obtained by adding a dispersant in the first and/or third steps.

In the case of the ink jet printing ink, it is preferred to use, as the third solvent, at least one member selected from the group consisting of nonpolar hydrocarbons whose main chain has 6 to 20 carbon atoms, water and alcoholic solvents (having not more than 15 carbon atoms).

BEST MODE FOR CARRYING OUT THE INVENTION

Figure 1:
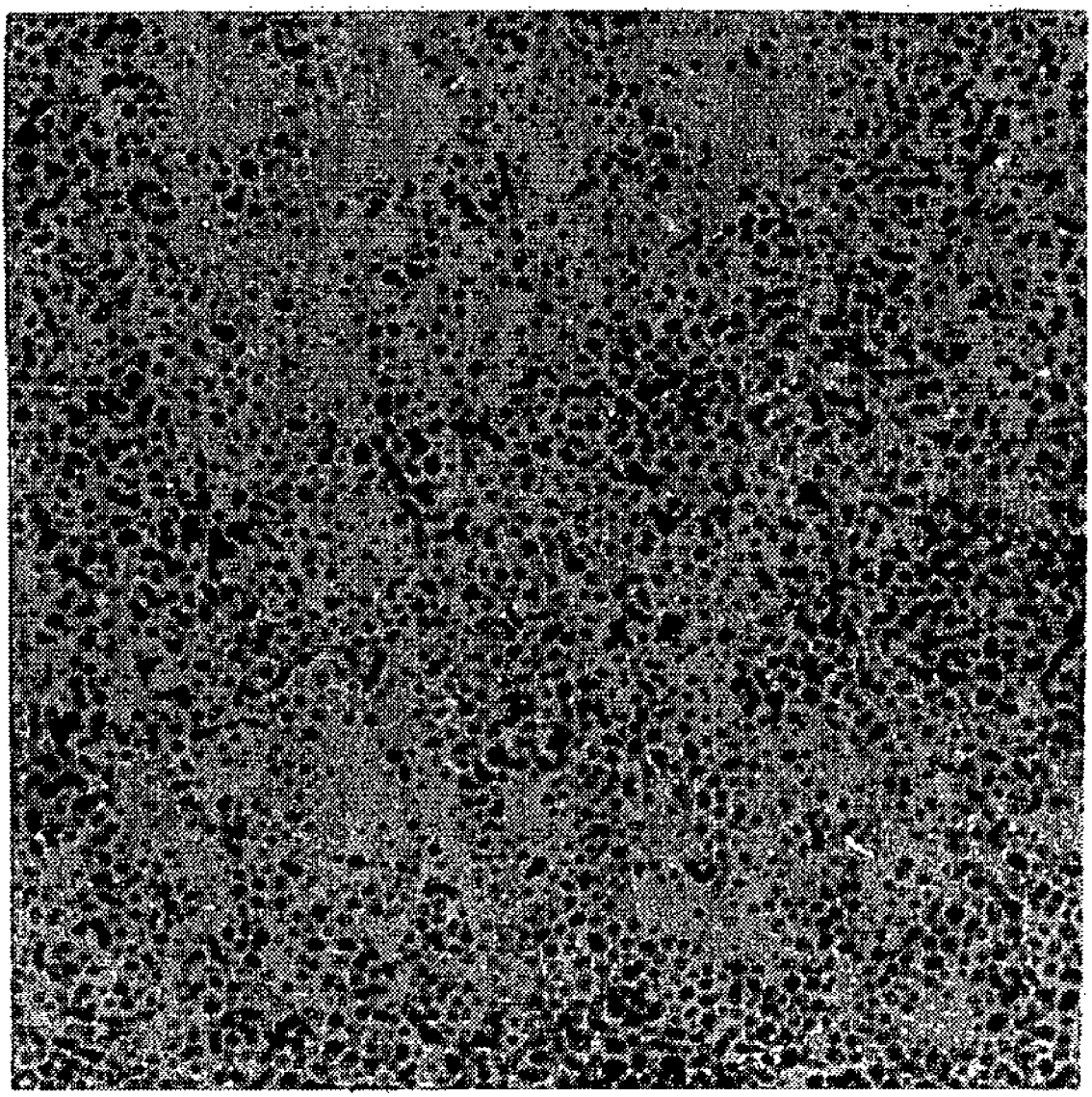
FIG. 1 is an electron micrograph showing the dispersed state of Au ultrafine particles in an independently dispersed Au ultrafine particles-containing liquid dispersion according to the present invention.

The modes for carrying out the present invention will be described in detail below.

Regarding the characteristic properties required for the ink jet printing ink, the ink should have a viscosity ranging from 1 to 100 mPa·s, preferably 1 to 10 mPa·s and a surface tension ranging from 25 to 80 mN/m, preferably 30 to 60 mN/m at the temperature (0 to 50° C.) at which the ink jet printing apparatus or printer is usually operated, in order to ensure such characteristic properties as the stability of the ink supply, the ability of forming ink drops, the injection (flight) stability and the fast or rapid responsibility of the printer head. The ink jet printing ink of the present invention satisfies such requirements or characteristic properties required for the ink jet printing ink.

As has been discussed above, the metal ultrafine particles used in the present invention can be prepared according to the evaporation-in-gas technique carried out in a low vacuum gas atmosphere and this technique permits the preparation of metal ultrafine particles having a uniform particle size on the order of not more than 100 nm, preferably not more than 10 nm. In the present invention, such metal ultrafine particles are used as a raw material and the solvent-substitution is carried out so that the metal ultrafine particles can suitably be used in the ink jet printing ink. Moreover, a dispersant is used for the improvement of the dispersion stability of the ultrafine particles in the liquid dispersion or the ink. Accordingly, it is possible to provide a liquid dispersion in which the metal ultrafine particles are independently, individually and uniformly dispersed, which can maintain their excellent fluidized state and which is accordingly quite suitable for use in the ink jet printing ink.

According to the present invention, when preparing a desired metal ultrafine particles-containing liquid dispersion using metal ultrafine particles prepared according to the evaporation-in-gas technique carried out in a low vacuum, in the first step, a metal is evaporated in a vacuum chamber in an inert gas atmosphere such as He gas atmosphere of not more than 10 Torr, vapor of at least one first solvent is introduced into the vacuum chamber and the surface of the growing metal particles is brought into contact with the vapor of the first solvent while growing the metal particles to thus give a liquid dispersion in which the resulting primary particles are independently and uniformly dispersed in a colloidal state; and then the first solvent is removed in the subsequent second step. In this respect, the first solvent is removed to eliminate any by-products produced through the denaturation of the coexisting first solvent when the metal vapor generated in the first step is condensed and to prepare a liquid dispersion containing ultrafine particles dispersed in, for instance, a low boiling point solvent, water or an alcoholic solvent, which is not easily used in the first step depending on the applications.

According to the present invention, in the second step, a low molecular weight polar solvent, as the second solvent, is added to the liquid dispersion prepared in the first step to thus precipitate metal ultrafine particles included in the liquid dispersion and the resulting supernatant is removed by, for instance, a technique in which the liquid dispersion is allowed to stand or the decantation technique to thus remove the first solvent used in the first step. The second step is repeated several times to thus substantially remove the first solvent. In the subsequent third step, solvent-substitution is carried out by the addition of the fresh third solvent to the precipitates obtained in the second step to thus obtain a desired metal ultrafine particles-containing liquid dispersion. Thus, there can be prepared a metal ultrafine particles-containing liquid dispersion in which the metal ultrafine particles having a particle size of not more than 100 nm are independently dispersed.

According to the present invention, the dispersant may if necessary be added in the first and/or third steps. When it is added in the third step, even a dispersant insoluble in the solvent used in the first step may be used.

The dispersant usable in the present invention is not restricted to any specific one and may be at least one member selected from the group consisting of alkylamines, carboxylic acid amides and amino-carboxylic acid salts. In particular, the alkylamine is preferably those whose main chain or skeleton has 4 to 20 carbon atoms, with alkylamines whose main chain has 8 to 18 carbon atoms being more preferred from the viewpoint of stability and easy handling ability. If the main chain of the alkylamine has less than 4 carbon atoms, it has such a tendency that it shows an extremely high basicity of the amine and it may attack or corrode the metal ultrafine particles and ultimately dissolve the same. On the other hand, if the main chain of the alkylamine has more than 20 carbon atoms, the resulting liquid dispersion may have an increased viscosity and this makes the handling ability thereof slightly poor when increasing the concentration of the metal ultrafine particles present in the liquid dispersion. Although all of the foregoing primary to tertiary alkylamines may function as dispersants used herein, primary alkylamines are suitably used in the present invention from the viewpoint of stability and easy handling ability.

Specific examples of alkylamines usable in the present invention are primary amines such as butylamine, octylamine, dodecylamine, hexadodecylamine, octadecylamine, cocoamine, tallowamine, hydrogenated tallowamine, oleylamine, laurylamine, and stearylamine; secondary amines such as di-cocoamine, di-hydrogenated tallowamine and di-stearylamine; and tertiary amines such as dodecyl dimethylamine, didodecyl monomethylamine, tetradecyl dimethylamine, octadecyl dimethylamine, cocodimethylamine, dodecyltetradecyl dimethylamine, and trioctylamine; and other amines, for instance, diamines such as naphthalenediamine, stearyl propylenediamine, octamethylenediamine and nonanediamine. In addition, specific examples of carboxylic acid amides and amino-carboxylic acid salts are stearic acid amide, palmitic acid amide, lauric acid laurylamide, oleic acid amide, oleic acid diethanolamide, oleic acid laurylamide, stearanilide and oleylaminoethyl glycine. At least one member selected from the group consisting of alkylamines, carboxylic acid amides and amino-carboxylic acid salts may serve as a stable dispersant in the present invention.

According to the present invention, the content of the alkylamine in the liquid dispersion containing metal colloid ranges from about 0.1 to 10 wt % and desirably 0.2 to 7 wt % on the basis of the mass of the metal ultrafine particles. If the content thereof is less than 0.1 wt %, the metal ultrafine particles are not individually dispersed in a liquid, they form aggregates and thus the liquid dispersion shows poor dispersion stability. On the other hand, if the content exceeds 10 wt %, the resulting liquid dispersion has a high viscosity and ultimately undergoes the formation of a gel-like product.

The metal ultrafine particles-containing liquid dispersion described above may have a variety of applications in addition to those in the printing and the formation of conductive circuits, but the liquid dispersion according to the present invention is used as an ink composition, in particular, ink jet printing ink for use in ink jet printers, which are cheap and become much more sophisticated and have recently, widely been used as a peripheral device for personal computers. Characteristic properties such as viscosity and surface tension required for the ink jet printing ink have already been described above. Moreover, in some cases, conditions for selecting solvents vary depending on the difference in the manner of its usage, for instance, a polar solvent such as water or an alcoholic solvent or a nonpolar hydrocarbon solvent is selected in such a manner that the use thereof is in agreement with the properties of the substrate used such as a glass or plastic substrate to be printed.

For instance, the first solvent is one for forming metal ultrafine particles and used in the practice of the evaporation-in-gas technique and is thus a solvent having a relatively high boiling point such that it can easily be liquefied upon the collection of the metal ultrafine particles through cooling. The first solvent may be one containing at least one alcohol having not less than 5 carbon atoms selected from the group consisting of, for instance, terpineol, citronellol, geraniol and phenethyl alcohol; or one containing at least one organic ester selected from the group consisting of benzyl acetate, ethyl stearate, methyl oleate, ethyl phenyl acetate and glycerides, which may appropriately be selected depending on the element constituting the metal ultrafine particles used or the applications of the resulting liquid dispersion.

Moreover, the second solvent may be any one inasmuch as it can precipitate the metal ultrafine particles present in the liquid dispersion prepared in the first step and can be removed through the extraction and separation of the first solvent and may, for instance, be a low molecular weight polar solvent such as acetone.

In addition, the third solvent usable herein may be selected from those, which are liquid at ordinary temperature, such as nonpolar hydrocarbons whose main chains each has 6 to 20 carbon atoms, water and alcohols having not more than 15 carbon atoms. When using a nonpolar hydrocarbon, if the main chain has less than 6 carbon atoms, it is quickly dried and this makes the handling of the resulting dispersion product difficult. On the other hand, if the carbon atom number thereof exceeds 20, the resulting dispersion has an extremely high viscosity and the resulting fired product of the dispersion is apt to include residual carbon. In the case of alcohols, if the carbon atom number thereof exceeds 15, the resulting dispersion has an extremely high viscosity and the resulting fired product of the dispersion is apt to include residual carbon.

Examples of such third solvents are long chain alkanes such as hexane, heptane, octane, decane, undecane, dodecane, tridecane and trimethyl pentane; cyclic alkanes such as cyclohexane, cycloheptane and cyclooctane; aromatic hydrocarbons such as benzene, toluene, xylene, trimethyl-benzene and dodecyl-benzene; and alcohols such as hexanol, heptanol, octanol, decanol, cyclohexanol and terpineol. These solvents may be used alone or in any combination. For instance, the solvent may be mineral spirit, which is a mixture of long chain alkanes.

Regarding the third solvent, it is sometimes necessary to use one different from that used in the first step (for instance, a solvent identical to that used in the first step but different in purity). The present invention is favorably applied to such cases.

The metal constituting the metal ultrafine particles used in the present invention is not restricted to any particular one inasmuch as it is a conductive metal and may appropriately be selected while taking into consideration the purposes and applications of the resulting liquid dispersion. Specific examples thereof include at least one metal selected from the group consisting of gold, silver, copper, palladium, tin or other various conductive metals, or alloys or oxides of these metals. In the case of oxides, ultrafine particles can be formed using oxygen, water or carbon dioxide in the atmosphere used for the evaporation of the metal. The foregoing at least one member selected from the group consisting of alkylamines, carboxylic acid amides and amino-carboxylic acid salts may serve as a dispersant for the metal ultrafine particles constituted by either of the foregoing elements and can provide a desired liquid dispersion of metal ultrafine particles.

The concentration of the metal ultrafine particles when the liquid dispersion containing the same is used in the formation of conductive circuits ranges from 10 to 70 wt % and preferably 10 to 50 wt %. If the concentration thereof is less than 10 wt %, the resulting liquid dispersion may satisfactorily possesses characteristic properties such as viscosity and surface tension required for the ink, but the electric resistance achieved after the firing of the coated liquid dispersion is insufficient for use as a conductive circuit, while if it exceeds 70 wt %, the resulting liquid dispersion never possesses characteristic properties such as viscosity and surface tension required for the ink. Therefore, the liquid dispersion cannot be used as the ink jet printing ink for forming conductive circuits.

The present invention will hereunder be described with reference to the following working Examples. These Examples are simple illustration of the present invention and the present invention is not restricted to these specific Examples at all.

EXAMPLE 1

When preparing gold (Au) ultrafine particles by evaporating Au at an He gas pressure of 0.5 Torr according to the evaporation-in-gas technique, the vapor of α-terpineol and octylamine in a ratio of 20:1 (volume ratio) was brought into contact with Au ultrafine particles during growing, the vapor mixture was cooled to collect an independently dispersed Au ultrafine particles-containing liquid dispersion, which contained 25 wt % of independently dispersed Au ultrafine particles having an average particle size of 0.008 μm in the α-terpineol solvent. To one volume of this liquid dispersion, there were added 5 volumes of acetone and the mixture was then stirred. The ultrafine particles present in the liquid dispersion were precipitated due to the action of the polar acetone. After allowing it to stand over 2 hours, the supernatant was removed, the same volumes of acetone as used above were added to the particles, the mixture was again stirred and the resulting supernatant was removed after allowing it to stand for 2 hours. These operations were repeated 5 times to completely remove the α-terpineol. To the resulting precipitates, there was freshly added dodecane as a nonpolar hydrocarbon and the mixture was stirred. The precipitated Au ultrafine particles were again uniformly dispersed. The Au particles in the resulting liquid dispersion had a particle size of about 8 nm and were completely independently dispersed in the dodecane (FIG. 1). This dispersion was quite stable and there was not observed any precipitation or separation even after the elapse of one month at ordinary temperature. The content of Au in the liquid dispersion was found to be 23 wt %, the viscosity thereof was 8 mPa·s and the surface tension thereof was 35 mN/m. This liquid dispersion was hereunder referred to as "Sample A".

EXAMPLE 2

When preparing silver (Ag) ultrafine particles by evaporating Ag at an He gas pressure of 0.5 Torr according to the evaporation-in-gas technique, the vapor of α-terpineol was brought into contact with Ag ultrafine particles during growing, the vapor mixture was cooled to collect an independently dispersed Ag ultrafine particles-containing liquid dispersion, which contained 20 wt % of independently dispersed Ag ultrafine particles having an average particle size of 0.01 μm in the α-terpineol solvent. To one volume of this liquid dispersion, there were added 5 volumes of acetone and the mixture was then stirred. The ultrafine particles present in the liquid dispersion were precipitated due to the action of the polar acetone. After allowing it to stand over 2 hours, the supernatant was removed, the same volumes of acetone as used above were added to the particles, the mixture was again stirred and the resulting supernatant was removed after allowing it to stand for 2 hours. These operations were repeated 5 times to completely remove the α-terpineol. To the precipitates, there was freshly added butylamine and further a mixed solvent of octanol and xylene, followed by stirring. The precipitated Ag particles were again uniformly dispersed. The Ag particles present in the resulting liquid dispersion had a particle size of about 10 nm and were completely independently dispersed in the mixed solvent. This liquid dispersion was quite stable and there was not observed any precipitation and separation even after the elapse of one month at ordinary temperature. The content of Ag in the liquid dispersion was found to be 18 wt %, the viscosity thereof was 7 mPa·s and the surface tension thereof was 32 mN/m. This liquid dispersion was hereunder referred to as "Sample B".

The results obtained in these Examples indicate that as for the solvent as a dispersion medium for the Au ultrafine particles-containing liquid dispersion, α-terpineol can be replaced with a nonpolar hydrocarbon solvent (Example 1) and that as for the solvent as a dispersion medium for the Ag ultrafine particles-containing liquid dispersion, α-terpineol can be replaced with the octanol-xylene mixed solvent (Example 2).

Fine lines having a width of 100 μm and a depth (or thickness) of 15 μm were drawn on a polyimide substrate using these Samples A and B as ink jet printing ink, respectively, and then the substrates were heated at 300° C. for 30 minutes in the air. As a result, there were obtained fine lines having a resistivity of $0.9 \times 10^{-5}$ ohm·cm for Sample A and $4.5 \times 10^{-6}$ ohm·cm for Sample B. These fine lines were subjected to a tape-peeling test and as a result, it was found that they were not peeled off even at peel strength of 3 kgf/mm$^2$ and had a high adhesive force.

INDUSTRIAL APPLICABILITY

As has been described above, the ink jet printing ink according to the present invention consists of an individually dispersed metal ultrafine particles-containing liquid dispersion comprising metal ultrafine particles and a dispersant. This ink has excellent characteristic properties required for ink and is accordingly suitable for use in the printing operations or the formation of conductive circuits making use of an ink jet printer.

Moreover, this ink jet printing ink can be prepared by a method comprising the first step in which metal vapor is brought into contact with vapor of the first solvent according to the evaporation-in-gas technique to thus form a metal ultrafine particles-containing liquid dispersion; the second step in which a low molecular weight polar solvent as the second solvent is added to the liquid dispersion to thus precipitate the metal ultrafine particles and to extract and remove the first solvent; and the third step in which the third solvent is added to the resulting precipitates to carry out solvent-substitution and to thus give a liquid dispersion containing metal ultrafine particles independently and uniformly dispersed therein. In this connection, it is possible to prepare ink jet printing ink consisting of a metal ultrafine particles-containing liquid dispersion having further improved dispersion stability, by the addition of at least one member selected from the group consisting of alkylamines, carboxylic acid amides and amino-carboxylic acid salts as a dispersant in the foregoing first and/or third steps.

The invention claimed is:

1. A method for preparing an ink jet printing ink consisting of an independently dispersed metal ultrafine particles-containing liquid dispersion, consisting of metal ultrafine particles, solvent, and dispersant; comprising: a first step in which a metal is evaporated in a gas atmosphere in the presence of vapor of a first solvent to thus bring the metal vapor into contact with the vapor of the first solvent, and the vapor mixture is cooled and collected to give a metal ultrafine particles-containing liquid dispersion in which the metal ultrafine particles are dispersed in the solvent; a second step in which a low molecular weight polar solvent, as a second solvent, is added to the liquid dispersion prepared in the first step to precipitate the metal ultrafine particles and the resulting supernatant is removed to thus substantially remove the first solvent; and a third step in which a third solvent is added to the precipitates thus recovered to give an independently dispersed metal ultrafine particles-containing liquid dispersion; wherein the dispersant is added in the first step or the third step, and the dispersant is selected from the group consisting of octylamine, laurylamine and butylamine, wherein the first solvent is $\alpha$-terpineol, the second solvent is acetone, and third solvent is selected from the group consisting of dodecane, octanol and xylene.

2. The method as set forth in claim 1 wherein the dispersant is contained in the range of 0.2 to 7 wt %.

* * * * *